United States Patent
Wu et al.

(10) Patent No.: US 6,727,131 B2
(45) Date of Patent: Apr. 27, 2004

(54) SYSTEM AND METHOD FOR ADDRESSING JUNCTION CAPACITANCES IN SEMICONDUCTOR DEVICES

(75) Inventors: Zhiqiang Wu, Plano, TX (US); Kaiping Liu, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/279,650

(22) Filed: Oct. 24, 2002

(65) Prior Publication Data

US 2003/0082894 A1 May 1, 2003

Related U.S. Application Data

(60) Provisional application No. 60/348,436, filed on Oct. 26, 2001.

(51) Int. Cl.[7] ............... H01L 21/8238; H01L 21/336; H01L 21/425
(52) U.S. Cl. ............ 438/199; 438/530; 438/306; 438/231; 438/289; 438/291
(58) Field of Search ................... 438/682, 528, 438/300, 302, 286, 287, 288, 289, 290, 291, 305, 306, 231, 301, 530, 199

(56) References Cited

U.S. PATENT DOCUMENTS

| | | | |
|---|---|---|---|
| 6,218,250 B1 | * | 4/2001 | Hause et al. ............ 438/302 |
| 6,265,293 B1 | * | 7/2001 | Yu ............................ 438/528 |
| 2003/0003640 A1 | * | 1/2003 | Lee .......................... 438/199 |

* cited by examiner

Primary Examiner—Matthew Smith
Assistant Examiner—Chuong Luu
(74) Attorney, Agent, or Firm—Peter K. McLarty; W. James Brady, III; Frederick J. Telecky, Jr.

(57) ABSTRACT

A method of forming a semiconductor device is provided that comprises forming a gate conductor proximate to and insulated from an outer surface of a semiconductor substrate. The gate conductor defines a channel region disposed inwardly from the gate conductor. Source and drain regions are formed in the semiconductor substrate, each disposed adjacent one edge of the channel region. The semiconductor substrate and the source and drain regions have an associated bottom wall junction capacitance. A transient enhanced diffusion anneal is used to affect ion concentration profiles associated with the source and drain regions, resulting in an increased balance in the ion concentration profiles of the source and drain regions and an ion concentration associated with the semiconductor substrate, which results in reduction of the bottom wall junction capacitance.

17 Claims, 2 Drawing Sheets

SYSTEM AND METHOD FOR ADDRESSING JUNCTION CAPACITANCES IN SEMICONDUCTOR DEVICES

This application claims priority under 35 USC §119(e)(1) of provisional application Ser. No. 60/348,436, filed Oct. 26, 2001.

TECHNICAL FIELD OF THE INVENTION

The present invention relates in general to semiconductor devices, and more particularly to a system and method for addressing junction capacitances in semiconductor devices.

BACKGROUND OF THE INVENTION

Semiconductor processing has become increasingly important in today's society. Generally, semiconductor manufacturers strive to improve processing or fabrication methods for electronic devices, which result in greater efficacy and overall speed in semiconductor products and components. One aspect of semiconductor processing relates to the n-type and p-type bulk regions of an electronic device. In some environments, the n-type and the p-type bulk regions of a semiconductor may operate generally as a capacitive interface as an associated channel region achieves conductivity. Sharp ion concentration boundaries at these regions may result in a high capacitance associated with and existing between the n-type and p-type bulk regions. Such high capacitances may generally operate to slow circuit speed or to hinder the performance of a semiconductor device.

SUMMARY OF THE INVENTION

According to one embodiment of the present invention, a method of forming a semiconductor device is provided that comprises forming a gate conductor proximate to and insulated from an outer surface of a semiconductor substrate. The gate conductor defines a channel region disposed inwardly from the gate conductor. The method additionally comprises forming source and drain regions in the semiconductor substrate. The source and drain regions are each disposed adjacent one edge of the channel region. The semiconductor substrate and the source and drain regions have an associated bottom wall junction capacitance. The method also comprises using a transient enhanced diffusion anneal to effect ion concentration profiles associated with the source and drain regions, resulting in an increased balance in the ion concentration profiles associated with the source and drain regions and an ion concentration associated with the semiconductor substrate. The increased balance achieves a reduction in the bottom wall junction capacitance.

Embodiments of the present invention provide a number of technical advantages. According to one embodiment of the present invention, a transient enhanced diffusion anneal step in a method of forming a semiconductor device operates to achieve approximate parity between the ion concentration of the substrate and the ion concentration of the deep source and drain regions of the semiconductor device at areas adjacent to the p-n junction. Parity refers to the creation of a wider area with a balanced ion concentration in the substrate that is not dominated by holes or electrons. This balancing or smoothing of an ion concentration profile results in a reduced junction capacitance as a vast number of n-type and p-type ions operate to cancel each other. The reduced junction capacitance may in turn operate to improve the overall speed and performance of the semiconductor device. Other technical advantages are readily apparent to one skilled in the art from the following figures, the description and the claims.

BRIEF DESCRIPTION OF THE DRAWINGS

To provide a more complete understanding of the present invention and features and advantages thereof, reference is made to the following description taken in conjunction with the accompanying drawings, in which.

DETAILED DESCRIPTION OF EXAMPLE EMBODIMENTS OF THE INVENTION

Example embodiments of the present invention and their advantages are best understood by referring now to FIGS. 1A through 2C of the drawings in which like numerals refer to like parts.

Figure 1A:
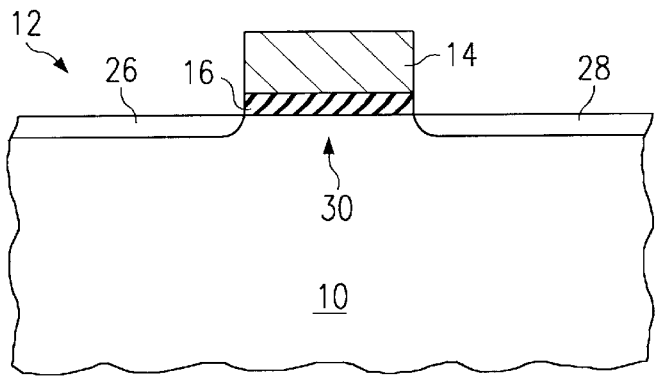
FIGS. 1A–1C are cross-sectional elevational diagrammatic views illustrating a series of processing steps associated with a method of constructing a semiconductor device according to one embodiment of the present invention.
Figure 1B:
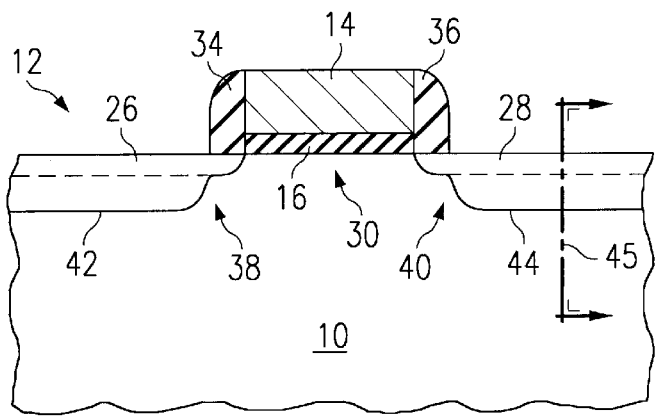
Figure 1C:
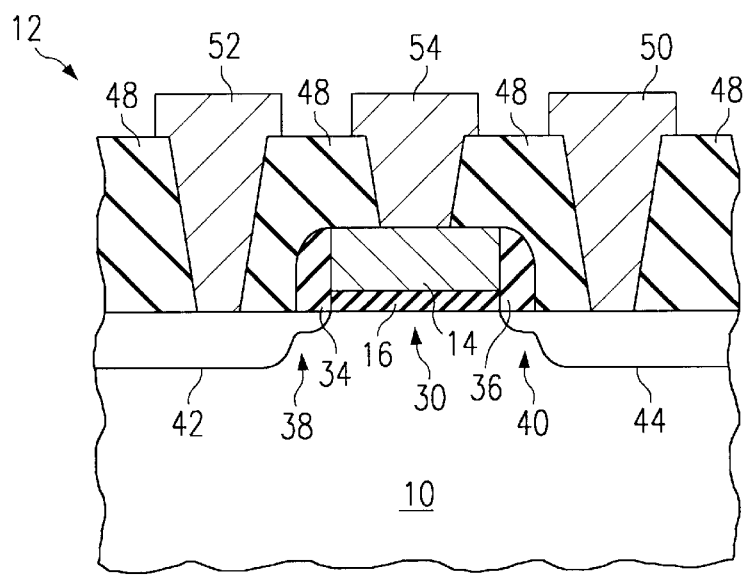

Referring now to FIGS. 1A through 1C, a series of processing steps is illustrated for forming a semiconductor device having a reduced bottom wall junction capacitance according to one embodiment of the present invention. Referring to FIG. 1A, a semiconductor substrate 10 comprises an outer surface 12, a gate conductor 14, which is formed proximate to outer surface 12, and a gate insulator 16. Substrate 10 may comprise silicon; however, substrate 10 may alternatively be formed of any monocrystalline or polycrystalline material, such as gallium arsenide (GaAs), for example. According to one embodiment of the present invention, substrate 10 is lightly doped with boron (acceptors) to create a p-type (holes) substrate (in a bulk formation or an epitaxial layer), having an accompanying ion concentration of approximately 5E14 to 8E16 ions/cm$^3$. The substrate may be implanted with suitable ions to raise the ion concentration near the surface or alternatively at any suitable depths for particular isolation needs. This ion concentration range is offered only for purposes of teaching the present invention; the ion concentration of substrate 10 may be varied where appropriate according to particular needs. Alternatively, the present invention contemplates that substrate 10 may be lightly doped with arsenic, phosphorous, or antimony (electrons) to create an n-type substrate where appropriate.

Gate conductor 14 may be formed according to suitable photolithographic and etching processes by conformally depositing, patterning, and etching a layer of suitable material, such as polycrystalline silicon, for example, following the growth of gate insulator 16. Gate conductor 14 has an approximate thickness of 1500 angstroms (Å), but may alternatively be any other suitable thickness according to particular needs. Gate insulator 16 is a layer of material such as silicon dioxide (SiO$_2$) that is grown to a suitable depth onto substrate 10. Gate insulator 16 is approximately 20 Å thick; however, the present invention contemplates that it may be any other suitable thickness where appropriate.

At this point in the semiconductor process, suitable ions may be implanted through the surface of substrate 10 according to suitable methods of ion implantation in order to form a partial source region 26 and a partial drain region 28. Such suitable implantation techniques may comprise an additive dose, for example, that includes a suitable number of ions having an appropriate energy level for achieving a desired ion concentration profile. According to one embodiment, the ionic implant introduced into substrate 10 is arsenic having an associated energy level in a range of 2 to 10 KeV, with an associated dose in a range of approximately 1E14 to 4E15 ions/cm$^2$. Alternatively, the ion implant used to form partial source and drain regions 26 and 28 may be phosphorous or antimony having suitable associated energy levels and dosages according to particular needs. The present invention contemplates that a halo implant having an opposite polarity may be implanted to improve a short channel effect, the halo implant comprising boron having an approximate energy range of 5 to 30 KeV, and an approximate dosage of 1E13 to 2E14 ions/cm$^3$. In the case where substrate 10 is lightly doped with n-type ions, the ionic implant used to form partial source region 26 and partial drain region 28 is boron having a suitable associated dosage and energy level.

As illustrated in FIG. 1A, partial source region 26 and partial drain region 28 are self-aligned with gate insulator 16 and formed adjacent to channel region 30 defined therebetween. Again, suitable photolithographic processes may be employed to form a suitable mask and define the outer edges of partial source region 26 and partial drain region 28. Channel region 30 is actuated and rendered conductive by a voltage potential established at gate conductor 14. It should be understood that the identification of partial source region 26 and partial drain region 28 as such are solely for convenience in the teaching of the present invention. Where appropriate, the semiconductor device of the present invention may be constructed as an electrically symmetrical device allowing current flow in either direction through channel region 30.

Referring now to FIG. 1B, a pair of opposing sidewall insulator bodies 34 and 36 are formed adjacent to gate conductor 14. Suitable photolithographic techniques, including depositing, patterning and anisotropically etching of a layer of $SiO_2$, silicon nitride ($Si_3N_4$) or combinations thereof may be used to form sidewall insulator bodies 34 and 36. Sidewall insulator bodies 34 and 36 may be used in subsequent implantation processes to slightly offset a relatively large concentration of ions from channel region 30, resulting in a reduced bottom wall junction capacitance as discussed in greater detail below.

FIG. 1B also illustrates the formation of a deep source region 38 and a deep drain region 40 by using suitable ionic implantation techniques, similar to those described above with reference to FIG. 1A. According to one embodiment of the present invention, the ionic implant introduced into substrate 10 in order to form deep source and drain regions 38 and 40 is phosphorous, having an associated energy level in a range of 5 to 70 KeV, with an associated dose in a range of approximately 1E13 to 2E15 ions/cm$^2$. Alternatively, the ion implant used to form deep source and deep drain regions 38 and 40 may be arsenic or antimony or any combination of such, having suitable associated energy levels and dosages according to particular needs. In the case where substrate 10 is lightly doped with n-type ions, the ionic implant used to form deep source and deep drain regions 38 and 40 is boron having a suitable associated dosage and energy level.

A hatched line is provided in both deep source region 38 and deep drain region 40 to illustrate the extension of partial source and drain regions 26 and 28 respectively. In addition, a source bottom wall junction interface 42 and a drain bottom wall junction interface 44 are illustrated in FIG. 1B. Interfaces 42 and 44 represent boundaries between deep source region 38 and deep drain region 40 and the inner portion of substrate 10. Additionally, a cross-sectional line 45 is illustrated in FIG. 1B as extending through deep drain region 40; cross-sectional line 45 is discussed in greater detail below with reference to FIGS. 2A–2C.

After completion of the formation of deep source region 38 and deep drain region 40, these regions may then be annealed with a transient enhanced diffusion (TED) anneal according to one embodiment of the present invention. The TED anneal extends approximately 10 to 120 minutes at a temperature range of 550° C. to 800° C.; however, the present invention contemplates that other suitable temperature ranges and time durations associated with the TED annealing step may be implemented where appropriate.

The TED anneal operates to diffuse an ion concentration established in prior steps of the semiconductor process while forming, for example, a p-type substrate and deep source and drain regions 38 and 40. The TED anneal results in a wider area with a balanced ion concentration or parity between a p-type and an n-type junction of an associated semiconductor device, as holes and electrons operate to counter-balance each other at areas adjacent to the p-n junction. This potential equilibrium results in a reduced junction capacitance at interfaces 42 and 44 in the absence of a sharp ion gradient as described in more detail below.

For purposes of teaching the present invention, it is helpful to identify the interaction at interfaces 42 and 44. Generally in a field effect transistor (FET), there are multiple parasitic internal junction capacitances associated with the device. These capacitances are a result of contrasting p-type and n-type doped areas at boundaries of the FET. A high concentration of ions at the surface of the substrate or semiconductor layer and a generally lower concentration of ions of opposite polarity in the bulk region of the substrate generate such a capacitance. The sharp ion gradient between these two areas generally causes a high capacitance as there is a precipitous change in ion concentration profiles at these bottom wall junction interfaces 42 and 44. Thus, deep source region 38 and deep drain region 40 essentially act as a capacitive interface where the lower portion of substrate 10 operates as a single opposing capacitor node for each of regions 38 and 40.

When a voltage potential is applied to an associated semiconductor device, channel region 30 is rendered conductive, i.e., as an area of potential current flow. One skilled in the art may appreciate that because of a sharp ion gradient in substrate 10, the voltage potential required to actuate an associated semiconductor device may be high, thus slowing the associated circuit because of the time necessary to charge the capacitive interface at deep source region 38 and substrate 10, and at deep drain region 40 and substrate 10 as described above.

The disclosed TED annealing step of the present invention operates to reduce the bottom wall junction capacitance at interfaces 42 and 44 between deep source and drain regions 38 and 40 and the lower portion of substrate 10. According to the teachings of the present invention, this annealing step smoothes the deep source and deep drain ionic profiles associated with deep source region 38 and deep drain region 40 respectively, resulting in more gradual ion concentration gradients across interfaces 42 and 44. This is because holes and electrons in substrate 10 are operating to cancel each other, i.e. they are creating a balanced gradient area at interfaces 42 and 44 (potentially resulting in an area that is approximately intrinsic in nature with respect to its ion concentration). This balancing or smoothing characteristic results in a reduced associated junction capacitance. Thus, junction smoothing and reduced capacitances are achieved with use of the present invention without the need to implement separate ionic implants to form or otherwise enhance deep source and deep drain regions 38 and 40 in an associated semiconductor device.

Such additional ionic implants may generally be undesirable because of their susceptibility to penetration of a polycrystalline gate stack in an associated semiconductor device. This is often the case because of the excessive energy generally associated with such ionic implants: the requisite excessive energy being needed to form a deep source region and a deep drain region in a given semiconductor substrate. It is a significant challenge in semiconductor processing to position ions uniformly in a semiconductor device without inadvertently puncturing certain regions within the substrate. According to the teachings of the present invention, this issue is addressed by such a TED annealing step, resulting in a reduction in bottom wall junction capacitances associated with interfaces 42 and 44. This in turn results in increased operation speed and greater efficacy of an associated semiconductor device.

According to the teachings of the present invention, once the TED anneal is completed, deep source region 38 and deep drain region 40 of the semiconductor device may then be annealed again using a rapid thermal anneal (RTA). The RTA may be at a temperature range of approximately 900° C. to 1100° C. for a duration in the range of less than 1 second (i.e. a spike in which there is a quick ramp up and ramp down) to 30 seconds; however, the present invention contemplates that other suitable temperature ranges and time durations may be implemented according to particular needs.

According to the teachings of another embodiment of the present invention, an optional ionic compensation implant may be used to achieve a suitable ionic concentration profile associated with deep source region 38 and deep drain region 40. The introduction of the ionic impurities may be done through suitable techniques, such as diffusion, etching, doping, bombarding or depositing, for example. The compensation implant may comprise an ionic impurity, such as boron, arsenic or phosphorous, or other suitable species. The compensation implant for an NMOS application has an associated approximate energy level of 10 KeV to 60 KeV, and an associated dosage in the range of approximately 1E13 to 2E15 phosphorous, antimony or arsenic ions/cm$^2$. The compensation implant for a PMOS application has an associated approximate energy level of 3 KeV to 20 Kev, and an associated dosage range of approximately 1E13 to 2E15 boron ions/cm$^2$. The disclosed implant energy level and associated dosage are provided only for purposes of illustration; these parameters may be varied or otherwise modified according to particular needs.

Referring to FIG. 1C, a semiconductor device is provided that is substantially complete. An interlevel isolation insulator layer 48 is conformally deposited covering the entirety of the semiconductor device architecture of the present invention. Isolation insulator layer 48 may comprise, for example, conformally deposited SiO$_2$. The outer surface of isolation insulator layer 48 is then patterned and etched using suitable photolithographic techniques to form openings exposing the contact points within the covered semiconductor device. A source contact 50, a drain contact 52 and a gate contact 54 are then formed within each of these openings using suitable photolithographic techniques to provide an electrical contact to deep source region 38 and deep drain region 40, respectively. Source contact 50, drain contact 52, and gate contact 54, may comprise, for example, aluminum, copper, polycrystalline or amorphous semiconductor material doped so as to be rendered conductive, or other appropriate metals or conductive materials according to particular needs.

Figure 2A:
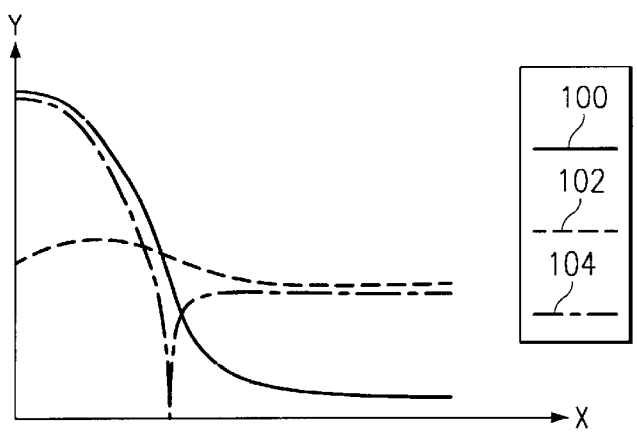
FIGS. 2A–2C are a series of graphical representations illustrating a series of ion concentration profiles associated with the method for constructing a semiconductor device of FIGS. 1A–1C according to one embodiment of the present invention.
Figure 2B:
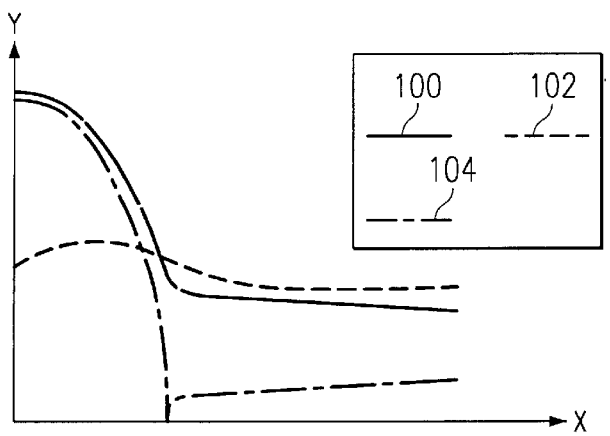
Figure 2C:
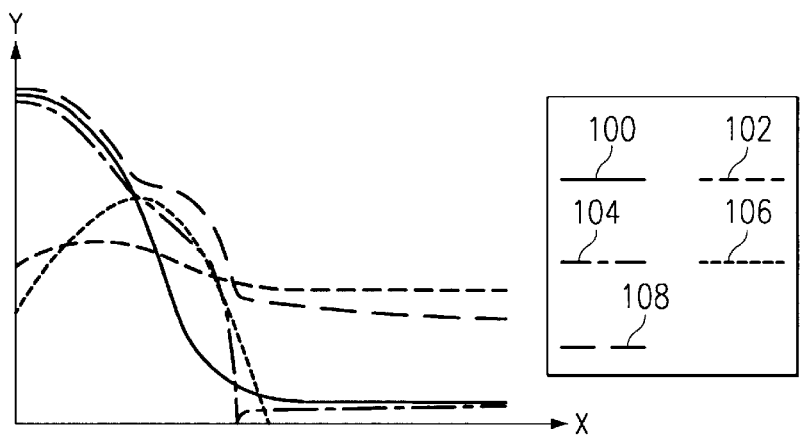

FIGS. 2A–2C are a series of graphical representations illustrating ion concentration profiles (reflected at a cross-section of deep drain region 40 at line 45 of FIG. 1B, for example) associated with a method for constructing a semiconductor device according to one embodiment of the present invention. Specifically, FIG. 2A represents a pre-anneal profile where linear depth is represented on the x-axis with a corresponding logarithmic scale of ion concentration being represented on the y-axis.

In accordance with one embodiment of the present invention, a p-type ion concentration profile 100 associated with substrate 10 is illustrated in FIG. 2A as declining fairly rapidly initially and reaching a constant p-type concentration as linear depth increases. An n-type ion concentration profile 102 of the semiconductor device is also represented in FIG. 2A, remaining substantially constant and experiencing only a small increase before reaching a constant n-type ion concentration as linear depth increases. A net ion concentration profile 104 illustrates a synthesis between p-type ion concentration profile 100 and n-type ion concentration profile 102. Net ion concentration profile 104 is illustrated in FIG. 2A as a line, which dips sharply at an associated junction before changing polarity and increasing and plateauing as linear depth increases. The net ion concentration profile 104 is proportional to the bottom wall junction capacitance as described above. Hence, a high net ion concentration profile correlates to a high junction capacitance, resulting in reduced circuit speed and efficacy of an associated semiconductor device.

It will be understood by those skilled in the art that a lower net ion concentration profile beneath an associated junction, not necessarily illustrated by FIG. 2A, is generally desired in the field of semiconductor processing; this reflects a wider area with increased balance in holes and electrons at interfaces 42 and 44. A reduced bottom wall junction capacitance associated with interfaces 42 and 44 may be achieved by the present invention by creating a concentration profile tail past the junction, reflecting an increased balancing of n-type and p-type ions between substrate 10 and both deep source region 38 and deep drain region 40 as illustrated in FIG. 2B.

FIG. 2B illustrates a profile associated with a method for forming a semiconductor device according to one embodiment of the present invention after the TED anneal, as described above with reference to FIG. 1B, is performed. Similar to FIG. 2A, FIG. 2B shows p-type ion concentration profile 100, n-type ion concentration profile 102, and net ion concentration profile 104. According to the teachings of the present invention, the additional TED annealing step operates to achieve a reduced net ion concentration profile 104.

The reduced net ion concentration profile 104 reflects a balancing of n-type and p-type ions at bottom wall junctions within substrate 10. The reduced net ion concentration profile 104 results in a reduced junction capacitance as the capacitive interface scenario, as described above, is effectively minimized or otherwise reduced, resulting in a shorter duration of time needed to render channel 30 conductive and thus actuate the associated semiconductor device. Hence, according to one embodiment of the present invention, the TED anneal before a final source-drain RTA anneal may be implemented to produce a wider area with an increased balance in the number of holes and electrons, i.e. the ionic concentrations at interfaces 42 and 44 resulting in enhanced efficacy and circuit speed of an associated semiconductor device.

FIG. 2C illustrates another ion concentration profile graph according to another embodiment of the present invention as described above with reference to FIG. 1B. In the illustrated graph of FIG. 2C, the optional ionic compensation implant as described above is implemented in order to further adjust the ionic concentration of deep source region 38 and deep drain region 40. The ionic concentration adjustment, as achieved by the compensation implant, is represented by an implant profile 106. Similar to FIGS. 2A and 2B, p-type ion concentration profile 100, n-type ion concentration profile 102, and net ion concentration profile 104 are represented. Compensation implant profile 106, however, operates to achieve a new total p-type ion concentration profile 108, creating an increased gradient balance between the ion concentrations associated with deep source region 38, deep drain region 40, and substrate 10. This optional implant, as described above with reference to FIG. 1B, may operate to further smooth net ion concentration 104, resulting in a reduced capacitance and thus enhanced speed and efficacy in an associated semiconductor device.

Although the present invention has been described in detail with reference to the particular embodiment illustrated in the architecture of FIGS. 1A–1C, it should be understood that various changes, substitutions, and alterations may be made hereto without departing from the spirit and scope of the present invention. For example, while the present invention has been described as including annealing processes for certain ranges of time at given temperatures, any appropriate temperatures and suitable time durations may be implemented in the foregoing process, provided the result is a reduced bottom wall junction capacitance or simply a smoothed or otherwise balanced net ion concentration profile.

Additionally, the present invention contemplates that several annealing steps may be used, as well as several ionic compensation implants implemented in the process, in order to achieve a reduction in the bottom wall junction capacitance; these minor modifications do not depart from the scope of the present invention. Such potential ionic implants may include isolation implants, channel-stop implants, or well implants, for example, or other suitable implants where appropriate. Also, while the process shown in FIGS. 1A through 1C illustrates the formation of a semiconductor device in close proximity to a substrate, the teachings of the present invention are equally applicable to the construction of a semiconductor device in an intermediate or outer level of a stacked configuration where no element of the semiconductor device architecture is proximate to the substrate.

Also, many of the ion concentrations, temperature ranges, and time durations have been provided for purposes of example only, potentially applicable in the field of CMOS or digital logic applications. Again these values have only been offered for purposes of teaching the present invention and could vary significantly in fields that involve power and analog devices, for example. Numerous other changes, substitutions, variations, alterations and modifications may be suggested to one skilled in the art, and it is intended that the present invention accommodate all such changes, substitutions, variations, alterations, and modifications as falling within the spirit and scope of the appended claims.

What is claimed is:

1. A method of forming a semiconductor device, comprising:

forming a gate conductor proximate to and insulated from an outer surface of a semiconductor substrate, the gate conductor defining a channel region disposed inwardly from the gate conductor;

forming source and drain regions in the semiconductor substrate, the source and drain regions each being disposed adjacent one edge of the channel region, the semiconductor substrate and the source and drain regions having a bottom wall junction capacitance associated therewith; and effecting a transient enhanced diffusion anneal of the source and drain regions causing ion concentration profiles associated with the source and drain regions to be affected resulting in an increased balance in the ion concentration profiles of the source and drain regions and an ion concentration profile associated with the semiconductor substrate such that a reduction in the bottom wall junction capacitance is achieve; and effecting a rapid thermal anneal on the source and drain regions after the transient enhanced diffusion anneal in order to enhance the increased balance in the ion concentration profiles of the source and drain regions and the ion concentration profile associated with the semiconductor substrate.

2. The method of claim 1, wherein the transient enhanced diffusion anneal is executed in a temperature range of approximately 550° C. to 800° C.

3. The method of claim 1, wherein the transient enhanced diffusion anneal has a time duration of approximately 10 minutes to 120 minutes.

4. The method of claim 1, further comprising introducing an ionic implant into the substrate such that the ion concentration profiles associated with the source and drain regions are affected in order to facilitate achievement of the increased balance.

5. The method of claim 4, wherein the introducing of the ionic implant comprises introducing ionic impurities comprising phosphorous into the semiconductor substrate having an associated energy level in a range of approximately 10 to 60 KeV and an associated dosage level in a range of approximately 1E13 to 2E15 ions/cm$^2$.

6. The method of claim 4, wherein the introducing of the ionic implant comprises introducing ionic impurities comprising boron into the substrate having an associated energy level in a range of approximately 3 KeV to 20 KeV and an associated dosage level in a range of approximately 1E13 to 2E15 ions/cm$^2$.

7. The method of claim 1, wherein the rapid thermal anneal is executed in a temperature range of approximately 900° C. to 1100° C.

8. The method of claim 1, wherein the rapid thermal anneal has a time duration of approximately 1 second to 30 seconds.

9. A transistor formed in a semiconductor layer comprising:

a gate conductor formed proximate to and insulated from an outer surface of the semiconductor layer, the gate conductor defining a channel region disposed inwardly from the gate conductor; and a source and a drain region, each disposed adjacent one edge of the channel region and each having an ion concentration profile associated therewith, wherein the source and drain region receive a rapid thermal anneal after the transient diffusion anneal in order to enhance the increased balance in the ion concentration profiles of the source and drain regions and the ion concentration profile associated with the semiconductor layer.

10. The transistor of claim 9, wherein the transient enhanced diffusion anneal is executed in a temperature range of approximately 550° C. to 800° C.

11. The transistor of claim 9, wherein the transient enhanced diffusion anneal has a time duration of approximately 10 minutes to 120 minutes.

12. The transistor of claim 9, wherein an ionic implant is introduced into the semiconductor layer such that the ion concentration profiles associated with the source and drain regions are affected in order to facilitate achievement of the increased balance.

13. The transistor of claim 12, wherein the introducing of the ionic implant comprises introducing ionic impurities comprising phosphorous into the semiconductor layer having an associated energy level in a range of approximately 10 to 60 KeV and an associated dosage level in a range of approximately 1E13 to 2E15 ions/cm$^2$.

14. The transistor of claim 12, wherein the introducing of the ionic implant comprises introducing ionic impurities comprising boron into the semiconductor layer having an associated energy level in a range of approximately 3 KeV to 20 KeV and an associated dosage level in a range of approximately 1E13 to 2E15 ions/cm$^2$.

15. The transistor of claim 9, wherein the rapid thermal anneal is executed in a temperature range of approximately 900° C. to 1100° C.

16. The transistor of claim 9, wherein the rapid thermal anneal has a time duration of approximately 1 second to 30 seconds.

17. A method of forming a semiconductor device, comprising:

forming a gate conductor proximate to and insulated from an outer surface of a semiconductor substrate, the gate conductor defining a channel region disposed inwardly from the gate conductor;

forming source and drain regions in the semiconductor substrate, the source and drain regions each being disposed adjacent one edge of the channel region, the semiconductor substrate and the source and drain regions having a bottom wall junction capacitance associated therewith;

introducing an ionic implant comprising boron into the semiconductor substrate having an associated energy level in a range of approximately 3 to 20 KeV and an associated dosage level in a range of approximately 1E13 to 2E15 ions/cm$^2$ such that ion concentration profiles associated with the source and drain regions is affected;

effecting a transient enhanced diffusion anneal in a temperature range of approximately 550° C. to 800° C. for a duration of approximately 10 minutes to 120 minutes of the source and drain regions causing the ion concentration profiles associated with the source and drain regions to be affected resulting in an increased balance in the ion concentration profiles of the source and drain regions and an ion concentration profile associated with the semiconductor substrate such that a reduction in the bottom wall junction capacitance is achieved; and effecting a rapid thermal anneal after the transient enhanced anneal on the source and drain regions in a temperature range of approximately 900° C. to 1100° C. for a duration of approximately 1 to 30 seconds, the rapid thermal anneal enhancing the increased balance in the ion concentration profiles of the source and drain regions and the ion concentration profile associated with the semiconductor substrate.

* * * * *